US006298465B1

(12) United States Patent
Klotchkov (10) Patent No.: US 6,298,465 B1
(45) Date of Patent: Oct. 2, 2001

(54) SKEW CALIBRATION MEANS AND A METHOD OF SKEW CALIBRATION

(75) Inventor: Ilya Valerievich Klotchkov, St. Petersburg (RU)

(73) Assignee: Process Intelligence Limited, Guernsey (GB)

( * ) Notice: Subject to any disclaimer, the term of this patent is extended or adjusted under 35 U.S.C. 154(b) by 0 days.

(21) Appl. No.: 09/342,227

(22) Filed: Jun. 29, 1999

Related U.S. Application Data (63) Continuation of application No. PCT/RU98/00204, filed on Jun. 29, 1998, and a continuation-in-part of application No. PCT/RU99/00194, filed on Jun. 10, 1998.

(51) Int. Cl.[7] ................................................. G11B 27/00
(52) U.S. Cl. ......................... 714/814; 714/815; 327/156
(58) Field of Search .................................. 714/814, 815, 714/736, 700, 718; 360/26; 713/400; 327/144, 156

(56) References Cited

U.S. PATENT DOCUMENTS

| | | | |
|---|---|---|---|
| 4,806,852 | * 2/1989 | Swan et al. | 324/73.1 |
| 4,903,024 | * 2/1990 | Evans et al. | 341/120 |
| 5,854,797 | * 12/1998 | Schwartz et al. | 714/724 |
| 5,935,256 | * 8/1999 | Lesmeister | 713/400 |
| 6,073,259 | * 6/2000 | Sartschev et al. | 714/724 |

FOREIGN PATENT DOCUMENTS

| | | | |
|---|---|---|---|
| 0 078 219 A2 | 5/1983 | (EP) | G01R/31/28 |
| 0 356 967 A2 | 3/1990 | (EP) | G01R/31/28 |

OTHER PUBLICATIONS

Bulaga, R.J. et al, "Maximizing and Maintaining AC Test Accuracy in the Manufacturing Environment", Proceedings of the International Test Conference, Nashville, Oct. 28–30, 1991, 1991, pp. 976–985, XP000272337, Institute of Electrical and Electronics Engineers.

"Calibration Method for Testers", IBM Technical Disclosure Bulletin, vol. 34, No. 11, Apr. 1, 1992, p. 182.

Internatioanl Search Report.

* cited by examiner

*Primary Examiner*—Albert Decady
*Assistant Examiner*—Guy Lamarre
(74) *Attorney, Agent, or Firm*—Sughrue, Mion, Zinn, Macpeak & Seas, PLLC (57) ABSTRACT

Automatic test equipment for memory device testing with elements providing a high accuracy of transferring and receiving signals when testing a semiconductor device under test (DUT) by intelligent skew calibration of a timing system. The device for automatic skew calibration of a transceiver comprises a plurality of input registers for transmitting signals; a plurality of output registers for receiving signals; a main clock driver for generating a main clock signal; a reference clock driver for generating reference signals for calibrating the registers; the reference clock driver being associated with the main clock driver; and a plurality of phase shifters comprising at least one set of phase shifters associated with each plurality of registers, for the relative alignment of the register's timing within each plurality. The calibration is performed using a common time base which is distributed by means of a transmission line having predetermined wave characteristics.

31 Claims, 6 Drawing Sheets

SKEW CALIBRATION MEANS AND A METHOD OF SKEW CALIBRATION

This is a continuation-in-part application of earlier filed applications PCT/RU98/00204, filed Jun. 29, 1998, and PCT/RU99/00194, filed Jun. 10, 1999, the disclosures of which applications are herein incorporated by reference.

TECHNICAL FIELD OF THE INVENTION

The present invention relates to automatic test equipment (ATE) for semiconductor device testing, and more specifically, to an apparatus, e.g. tester, for testing and measuring a semiconductor device, such as a memory and to a method of timing calibration. In particular, the invention relates to the accurate and automatic calibration of ATE input and output pin driver timing.

The present invention is particularly applicable to test equipment for testing semiconductor memories and logic to make possible the precise and continuous testing of logic and memory devices at wafer probe stage, or as dies or packaged parts, or in modules or circuits.

BACKGROUND OF THE INVENTION

Test systems used for testing semiconductor devices should be able to test each new generation of devices at the maximum speed of the new device. A testing apparatus for a digital circuit generates various waveforms at a desired timing and detects the voltage level of the waveforms, usually comparing data read from the device under test with what is expected. The timing system is one of the most critical specifications of a tester. At present, typical systems provide a 60-ps resolution, 500-ps maximum driver-to-driver skewing and 700-ps maximum edge placement error. The overall timing accuracy is within ±1.5 ns. For the new generation of high-speed devices, the accuracy should be within a few hundred picoseconds. To achieve this increased accuracy, it is essential to calibrate the timing of the testing apparatus.

The invention is particularly appropriate for memory devices. Semiconductor memories tend to have a large number of input and output pins, for example, 36 pins, and are tested 16 or 32 at a time, requiring 36×32 tester pins. Consequently, the tester requires a large number of units of a per-pin structure, each of which needs timing calibration, since it is necessary to ensure that the timing of all voltage transitions delivered to the pins of the DUT, and the time at which data output from the device is compared with expected data, are accurate in relation to a defined reference. However, these transitions often occur at different times, due to the fact that signals travelling a channel path to a DUT must pass through cables, formatters, drivers and other devices having different electrical characteristics. The resulting timing variations are called "skew". Generally, calibration involves measuring the skew in each system input and output channel and compensating for it by means of a variable delay in each channel (e.g., see U.S. Pat. No. 5,274,796). Hardware, software and a combination thereof can be used to control the compensating delay.

The traditional approach involves serially calibrating tester pin timing with respect to a reference pin or an external reference (see, e.g. U.S. Pat. No. 5,712,855). Since pin calibration measurements must be performed sequentially, an enormous amount of time is needed for this method. The amount of measured data required is also large; thus, the transfer and calculation time is undesirably long.

Another conventional approach which alleviates the above problems is described in U.S. Pat. No. 5,477,139, wherein the calibration is performed in parallel. This method shortens the time required for timing measurements, however, it increases the cost of the whole measuring apparatus, as it uses a number of local sequencers, one for each pin of the device under test (DUT).

Another means to execute the skew adjustment in parallel for all terminals of the IC tester is described in EP 356,967 A2. The disadvantage of the known method is that the skew adjustment is performed manually by an operator.

Another widely used calibration technique uses time domain reflectometry (TDR) based on transmission line theory. According to this theory, a wave travelling through a transmission line terminated by anything other than the line's characteristic impedance is reflected back through the line. If the line terminates with an open circuit, the reflected wave equals the forwarded wave and this reflected wave is detected by the pin electronics. Using TDR techniques, automatic calibration circuits are provided to measure channel delays to the open circuited contact points of the tester. However, this approach has the disadvantage of requiring many delay compensation circuits per pin driver.

A method of autocalibrating a tester's timings with respect to a common reference point is described in "Maximising and maintaining AC test accuracy in the manufacturing environment" by R. J. Bulaga and E. F. Westermann, Proceedings of the International Test Conference, Nashville, 1991, p.p. 976–985, IEEE. However, the known method is adapted for calibrating the skew of non-cyclic, e.g. asynchronous, test signals, requires the use of multiple bulk hardware and makes the system dense, and cost-ineffective. It takes about 30 seconds to perform a complete calibration, which is slow for conventional memories.

An automatic skew calibration circuit described in U.S. Pat. No. 5,384,781 provides a calibration technique for multi-channel signal sources using a means for varying the delay in response to a skew signal and determining a calibrated value for the delay. The circuit comprises a pair of cross-coupled flip-flops and a microprocessor. This method takes account of the variations in the time at which different flip-flops change state. It provides a fast calibration method which may be performed easily and frequently to correct the skew errors in signal sources. However, the technique becomes extremely complicated when the number of signal sources increases; moreover, it is not cost-effective in semiconductor memory test equipment with a large number of signal sources.

One of the main limitations of the known approaches to signal skew calibration is that the accuracy of measuring the signal skew decreases with the increasing speed and complexity of each new generation of high-speed synchronous devices. In a modern context, not only input/output signal skew compensation is needed, but also a significant improvement in the accuracy of measuring the skew itself, where there are multiple error sources and skew compensating delays. The necessity of increasing the accuracy of skew calibration creates a requirement for a fast, automatic calibration system providing extremely precise automatic calibration in test systems with multiple signal sources.

SUMMARY OF THE INVENTION

The object of the present invention is the provision of an ATE system that can perform highly accurate semiconductor testing by maintaining the precise timing characteristics of registers and providing precise calibration in relation to multiple signal sources, while at the same time reducing test time and tester cost and simplifying header characterisation.

The advantage of the present invention is the ability of an ATE system using a skew calibration circuit incorporated in the tester's header to reduce or substantially eliminate the timing skew between different signal sources and thus to enhance the accuracy of testing and provide acceptable and adequate testing of high-speed synchronous memory devices. According to the proposed invention, registers for latching data to and/or from the DUT are positioned in the test head or on the header, a card holding probe pins or sockets, to reduce the signal path to and/or from the DUT and thus avoid excessive distortion of the timing signal. Skew control may be performed by calibrating the tester's registers only. The overall system is thus greatly simplified because it is not necessary to use programmable delays for each pin and the number of units to be calibrated is reduced, in comparison to conventional systems which require calibration of each pin driver. By using a common reference clock driver to calibrate the output registers, the delay between the moment when the register actually latches input data and the reference clock edge may be measured with greatly increased accuracy. An important advantage of the proposed system is that it also allows fast calibration to be carried with each DUT. This is especially important because various characteristics of a DUT itself may interfere with the operation of the registers and influence the accuracy of skew calibration.

The substance of the present invention is an automatic skew calibration means for skew calibration of a transceiver, for example, for calibrating the skew of signals transmitted to the DUT and received from the DUT in the course of a testing procedure, thus providing highly accurate testing of synchronous memory devices. The calibration is performed using a common time base which is available at different points on the calibration circuit, by which a reference signal is distributed from the reference clock source to the output registers.

The proposed means may be incorporated in the tester's header or may be implemented as a separate unit connected to the tester's header.

The number of input and output registers is defined by the number of registers in the DUT to be tested and may be one hundred or more. The registers may be implemented in, for example, but not limited to, flip-flops, latches or any other suitable means for latching signals.

A conventional clock generator may be used as a main clock source. The reference clock circuit may contain a plurality of phase shift means, e.g. a set of programmable delays, to provide a means for delaying the signal with respect to the main clock. The main clock source may be implemented, for example, by a PLL (Phase Lock Loop) clock generator, e.g. SY89429A manufactured by Synergy Semiconductor Corp. (U.S.A.), or by Analogue Devices, or similar fabrications by Vitalec or Edge Semiconductors.

The important feature of the present invention is that the DUT may be connected to the calibration means during the calibration operation, thereby allowing the electric characteristics of the DUT to be taken into account. The DUT characteristics, for example capacitance, may be measured after calibrating the tester. This feature is especially significant for CMOS logic, where timing is load capacitance dependent. Moreover, unlike conventional testers, which require the tester's header to be changed whenever a new type of DUT is to be tested, the present invention allows the same tester to be used for testing different types of DUTs. In general, the proposed calibration means may be used for calibrating the timings of different systems for transmitting and receiving signals, typically called transceivers. A particular case of a transceiver is an electronic circuit tester for testing semiconductor devices.

Thus, in one aspect, the invention is an automatic skew calibration means for calibrating the timings of a transceiver, in particular, a semiconductor device testing apparatus, comprising:

a plurality of input registers for transmitting signals;

a plurality of output registers for receiving signals;

a main clock means for generating a main clock signal;

a reference clock means for supplying reference signals for calibrating the registers, the said reference clock means being associated with the said main clock means; and a first plurality of phase shift means, comprising at least one set of phase shift means associated with each plurality of registers, for relative alignment of the register's timing within each plurality.

The calibration means comprises a transmission line having predetermined wave characteristics, for distributing a reference signal from the reference clock means to the output registers.

Preferably, each the said set of phase shift means comprises at least one shift means associated with each separate register, for delaying the timing of that register.

To further enhance its accuracy, the skew calibration means preferably additionally comprises:

a second set of phase shift means associated with the said pluralities of registers, to allow the relative alignment of the registers' timing between the said pluralities, the said plurality of input registers and the said plurality of output registers being connected to the main clock means via the second set of phase shift means. An important feature of the present invention is that the said plurality of output registers is operable to calibrate the said plurality of input registers.

Preferably, the said second set of phase shift means comprises at least one shift means associated with each plurality of registers.

Preferably, the said output registers are series-connected to the said reference clock means by the said transmission line.

Preferably, at least one or, more preferably, all of the components including the said plurality of input registers, the said plurality of output registers and the said reference clock means are parts of a tester header.

Another aspect of the present invention is a method of automatic transceiver skew calibration comprising:

calibrating a plurality of transceiver output registers with respect to a reference clock edge;

calibrating the propagation delay of the input registers of the transceiver using the calibrated output registers; and relative alignment of the measured delays to the main clock edge.

Preferably, the method further comprises, before the said operation of calibrating the output registers, an operation of calibrating each programmable delay.

The method preferably further includes a step of increasing the accuracy of the test system in which the transceiver is used by determining the minimal feasible time delay between the reference clock edge and the moment when the register latches data. The calibration may be performed for each register or for pluralities of registers. It should also be noted that the measurements may be carried out for each bit of data transferred to or from the register.

Another aspect of the present invention is a test system for testing semiconductor devices comprising a timing means, a fault logic, and a central control unit, and also a set of input registers and a set of output registers, the said registers being calibrated using the calibration means and/or the calibration method proposed in the present invention. The test system may be calibrated in relation to a particular device under test to take into account the device characteristics that may interfere with the operation of the test system. Preferably the test system has the built-in calibration means proposed in the present invention. In particular, the calibration means may be incorporated in the tester's header.

Another aspect of the present invention is a method of testing semiconductor devices including a step of transmitting a pattern of signals for accessing memory elements within the device, a step of receiving response signals for detecting failures in the memory elements and a step of processing test results, the method including a step of automatic skew calibration using the calibration means proposed in the present invention. Preferably, the skew calibration includes a step of determining the minimal feasible time delay between the reference clock edge and the moment when the register latches input data.

Still another aspect is a computer program for implementing, simulating or emulating the hardware functions of the skew calibration means or for computer implementation of the method in accordance with the present invention.

BRIEF DESCRIPTION OF THE DRAWINGS

For a better understanding of the present invention and the advantages thereof and to show how the same may be carried into effect, reference will now be made, by way of example, without loss of generality, to the following description now taken in conjunction with the accompanying drawings in which.

The invention will now be described, without loss of generality, with the aid of an example embodiment.

DETAILED DESCRIPTION OF THE INVENTION

Figure 1:
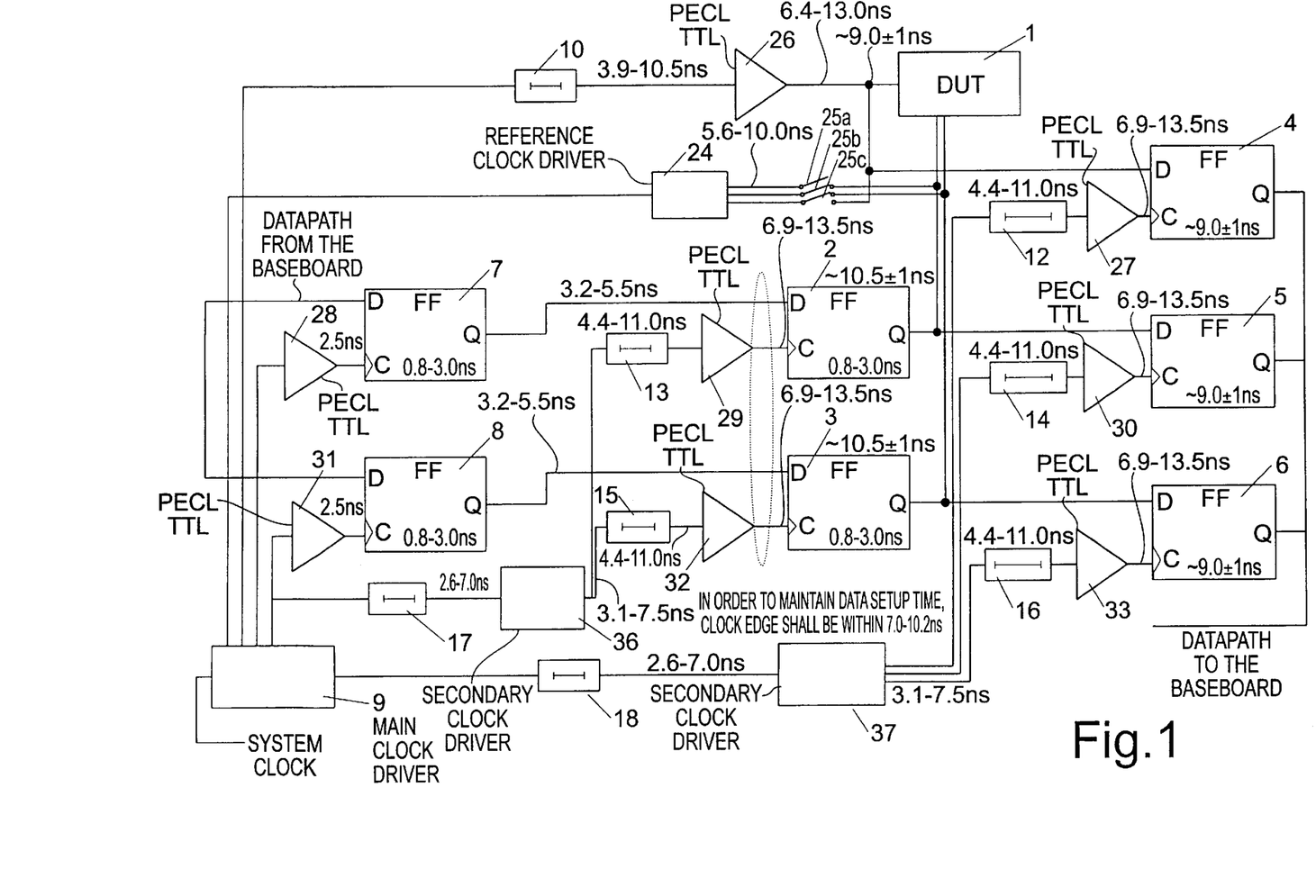
FIG. 1 is a fragmentary circuit diagram of the skew calibration means in accordance with one of the embodiments of the present invention.
Figure 6:
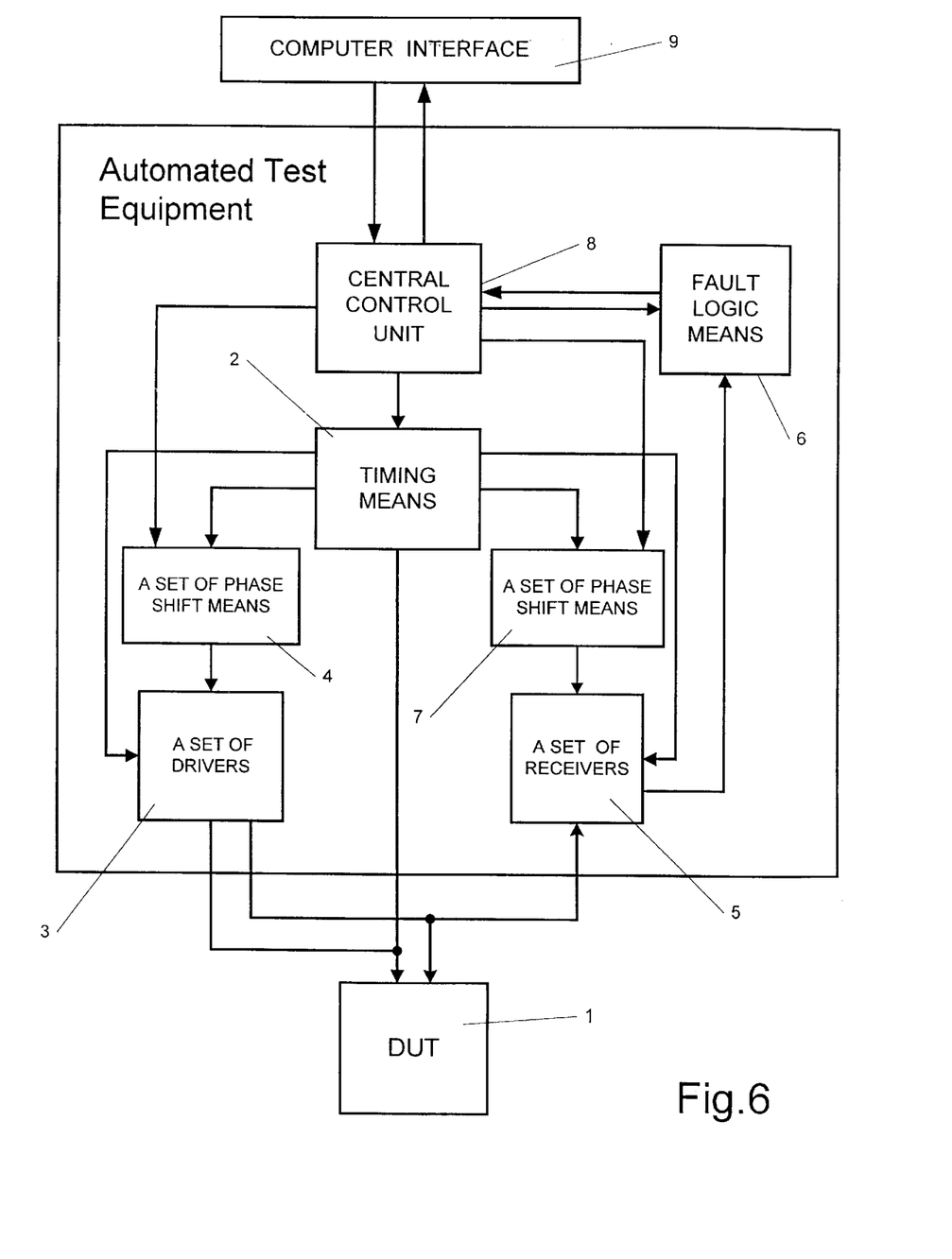
FIG. 6 shows a schematic block diagram of the test system in accordance with the present invention.

In FIG. 1 a fragmentary block scheme of a tester header with a built-in skew calibration means in accordance with one of the embodiments of the present invention is shown. The remaining circuitry partially shown in FIG. 6 is conventional circuitry containing different elements, such as formatters, master clocks, programmable delays, switches, etc, which are utilised to generate the test signals. The calibration means of the present invention is adapted for providing calibration of test data between the actual transmitting and receiving registers and the DUT. Typically used registers include conventional flip-flops and latches.

Illustrated in FIG. 1 are a plurality of input registers 2–3 for transmitting test signals to the device 1 under test (DUT), including data, address and control signals transmitted from the registers, and a plurality of output registers 4–6 for receiving response signals from the DUT. The clock signals are transmitted to the DUT from the main clock driver via, sequentially, a programmable delay 10 and a logic translator means 26.

The outputs of the input registers 2,3 are connected to the DUT 1 and to the inputs of the output registers 4–6. The clocks of the input registers 2, 3 are connected via logic translator means 29, 32 and delays 13, 15, respectively, to the output of the secondary clock driver 36 for maintaining data setup time for the input registers and DUT. To achieve this, the input of the secondary clock driver 36 is connected via programmable delay 17 to the main clock driver 9.

The clocks of the output registers 4,5,6 are connected via logic translator means 27, 30 and 33 and delays 12, 14 and 16 to the output of the secondary clock driver 37. The input of the secondary clock driver 37 is connected via programmable delay 18 to the main clock driver 9 for alignment of the fault strobe to the DUT clock. One more set of registers 7–8 is adapted to allow the signal entering the input registers to be independent from the path length from the baseboard; the inputs of the registers 7–8 are connected to the baseboard, while their outputs are connected to the inputs of the input registers 2–3. The clocks of the registers 7,8 are connected via logic translator means 28 and 31, respectively, to the main clock driver 9. It should also be noted that the number of registers is not limited and may be, for example, one hundred or more. A main clock driver 9 is provided for generating timing signals for the tester. Preferably, the main clock driver 9 generates clock signals at different frequencies.

To perform the calibration of the tester, programmable delays 12, 14, 16 are provided to compensate for the differences in signal paths from the DUT and delays 13, 15 are provided to compensate for the differences in signal paths to the DUT. Generally, the set of phase shift means (e.g., programmable delays) may comprise, for example, one or more shift means for relative alignment of the registers's timing within each plurality, i.e. the number of delays may be less or greater than the number of registers within each plurality.

Preferably, at least one calibration shift means is used for delaying the timing of each separate register within the plurality, as shown in FIG. 1; i.e. delays 13,15 are used for calibrating the timing of the input registers 2,3, respectively, while delays 12,14,16 are used for calibrating the timing of the output registers 4,5,6 respectively.

Another set of phase shift means, in this case, including delays 10, 17 and 18, is reserved for shifting secondary clocks in relation to main clock to provide individual fan-out for the registers. The second set of phase shift means is also used for relative alignment of the register's timing between the said pluralities. Preferably, at least one delay from the second set of delays is associated with each of the plurality of registers. As seen in FIG. 1, both the plurality of input registers and the plurality of output registers are connected to the main clock means via the said second set of phase shift means.

Any suitable means may be used for phase shifting, e.g. as already mentioned above, conventional programmable delays. The delays may be implemented, for example, using a SY100E195 manufactured by Synergy Semiconductor Corp. (U.S.A.), or by Analogue Devices, or by Edge Semiconductor Devices.

In order to maintain the timing skew within the predetermined accuracy during the testing operation and in case a new type of memory device is to be tested, it is necessary to be able to calibrate the test system periodically to determine whether any changes have occurred as a result of temperature variations, aging, or any other factors. To perform the calibration operation, a reference clock driver 24 for supplying the reference clock signal for the registers is incorporated in the circuit and connected to the registers through reference clock switches 25a, 25b and 25c. During normal operation mode, switches 25 are open and the reference clock is disconnected from the data lines.

Figure 2A:
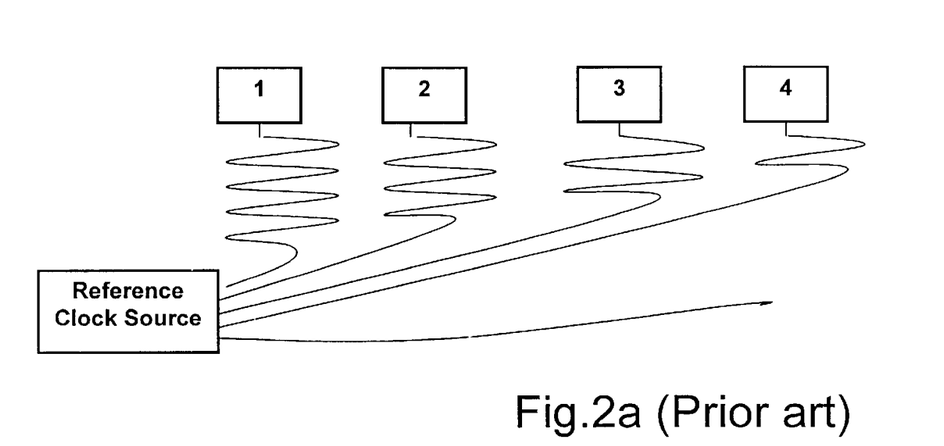
FIG. 2a illustrates a method of introducing a common node according to a prior art method.
Figure 2B:
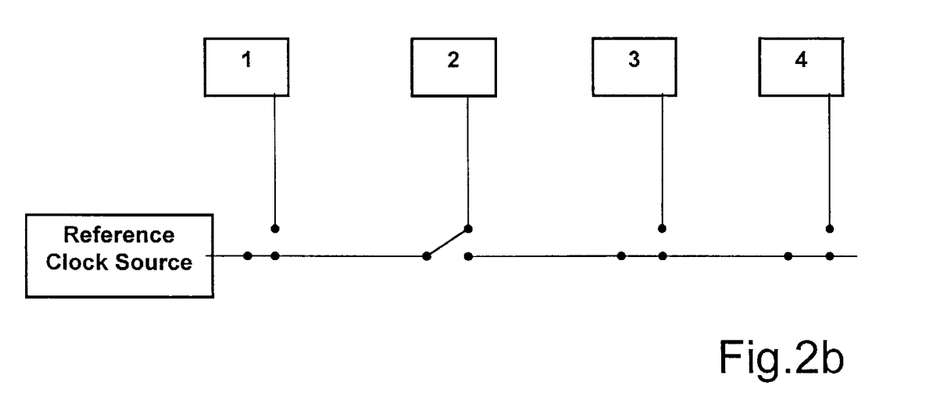
FIG. 2b illustrates the transmission line for introducing a common time base according to the invention.
Figure 2C:
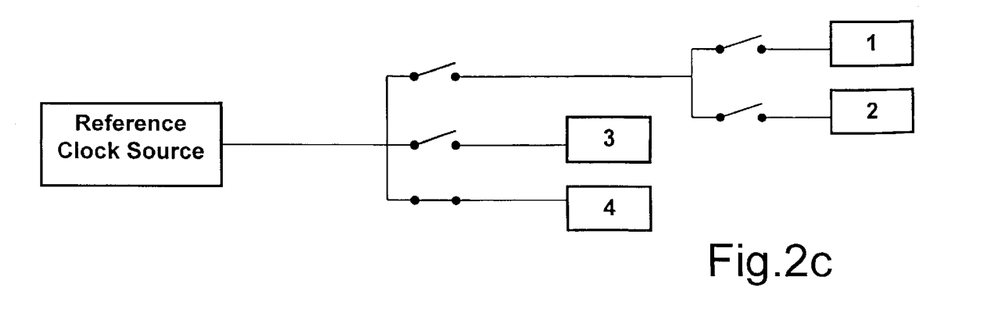
FIG. 2c illustrates the transmission line with a series of switches for introducing a common time base according to the invention.

It should also be noted that the common time base, i.e. the main clock, is introduced into the calibration circuit in accordance with the present invention by means of a "distributed common node". In a typical skew calibration circuit, e.g. as described in U.S. Pat. No. 4,827,437, a common node is introduced by means of multiple cables disposed between the node and each test terminal, each of the cables identical in length and internal impedance (see FIG. 2a). According to the present invention, a common transmission line of known wave characteristics is used to create the common time base which is available at different points in the circuit, as shown in FIG. 2b. Thus, each point connected to the transmission line is provided with a common time base which may easily be calculated from the signal propagation rate in this transmission line. As a result, there is no necessity to use cables of equal length to provide a common time base. The transmission line may be provided with a series of switches to commutate registers as desired, as shown, for example, in FIG. 2c. Different switch patterns can be created as it is evident for a specialist in the art.

Referring to FIG. 1, the reference clock signal is distributed from the reference clock driver 24 to the registers 4,5,6 via a common transmission line. Each output register 4,5,6 is series-connected to the said transmission line, permitting a transmission line of a minimal length to be used and thus minimising the signal fluctuations along the line.

If necessary, as shown in FIG. 1, a number of logic translator means 26–33 of a PECL-to-TTL type, e.g. SY100ELT23 manufactured by Synergy Semiconductor Corp. (U.S.A.), may be provided for translating PECL signals used in the clock circuit into TTL signals used in the DUT circuit. However, in particular applications these translators may not be needed and may be omitted.

The operation of the skew calibration means will now be described in more detail.

The calibration procedure is performed in four operations comprising:

(1) calibrating each programmable delay to determine its actual delay characteristics;

(2) calibrating a plurality of output registers in relation to the reference clock edge;

(3) calibrating the propagation delay of the input registers using the calibrated output registers;

(4) providing relative alignment of the measured delays to the main clock edge. The first three of these four calibration operations are performed using a special calibration technique proposed in the present invention. The technique comprises varying the programmable delay using a system sequencer (not shown) to cover the whole delay range and determining for each bit of the register the probability that it will be in one of the possible states, i.e. the "0" or "1" state. The calibration is performed by incrementing the corresponding delay from zero to maximal value; the result $S_i$ of i-determination for a given bit of a given register is calculated R times at given conditions, each determination being repeated until a statistically sufficient number R of meanings is obtained. The flow chart of this calibration operation is shown in FIG. 3, where $\Sigma Si/R$ is an averaged result of the above determination.

Figure 4A:
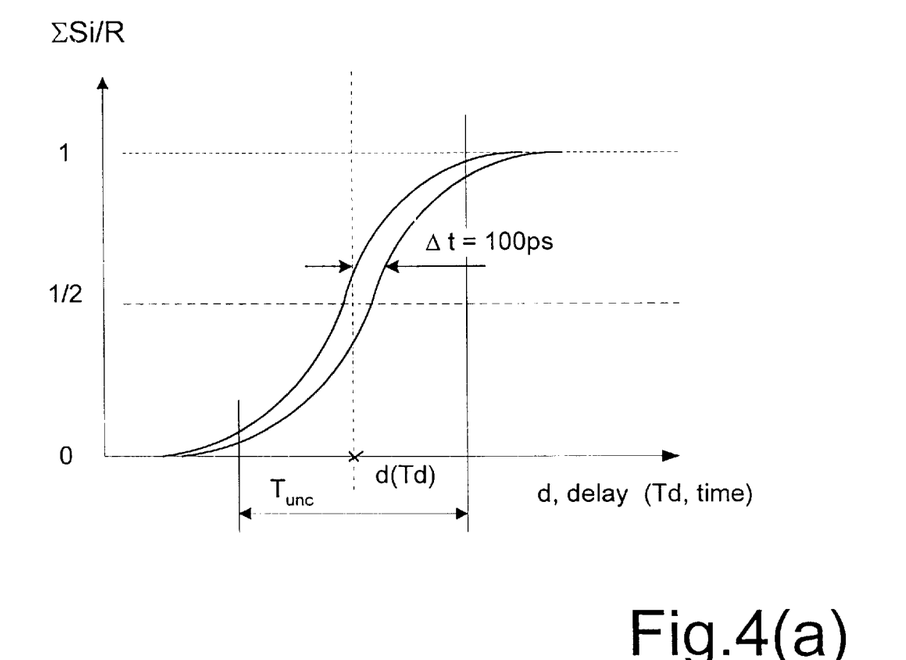
FIG. 4a shows a graph of the step of calibration of registers performed by incrementing the delay corresponding to the register from zero to maximal value.

On the basis of the data obtained, a graph is plotted showing the point where the above probability is equal to 50%. The graph of this calibration operation is illustrated in FIG. 4(a).

Figure 3:
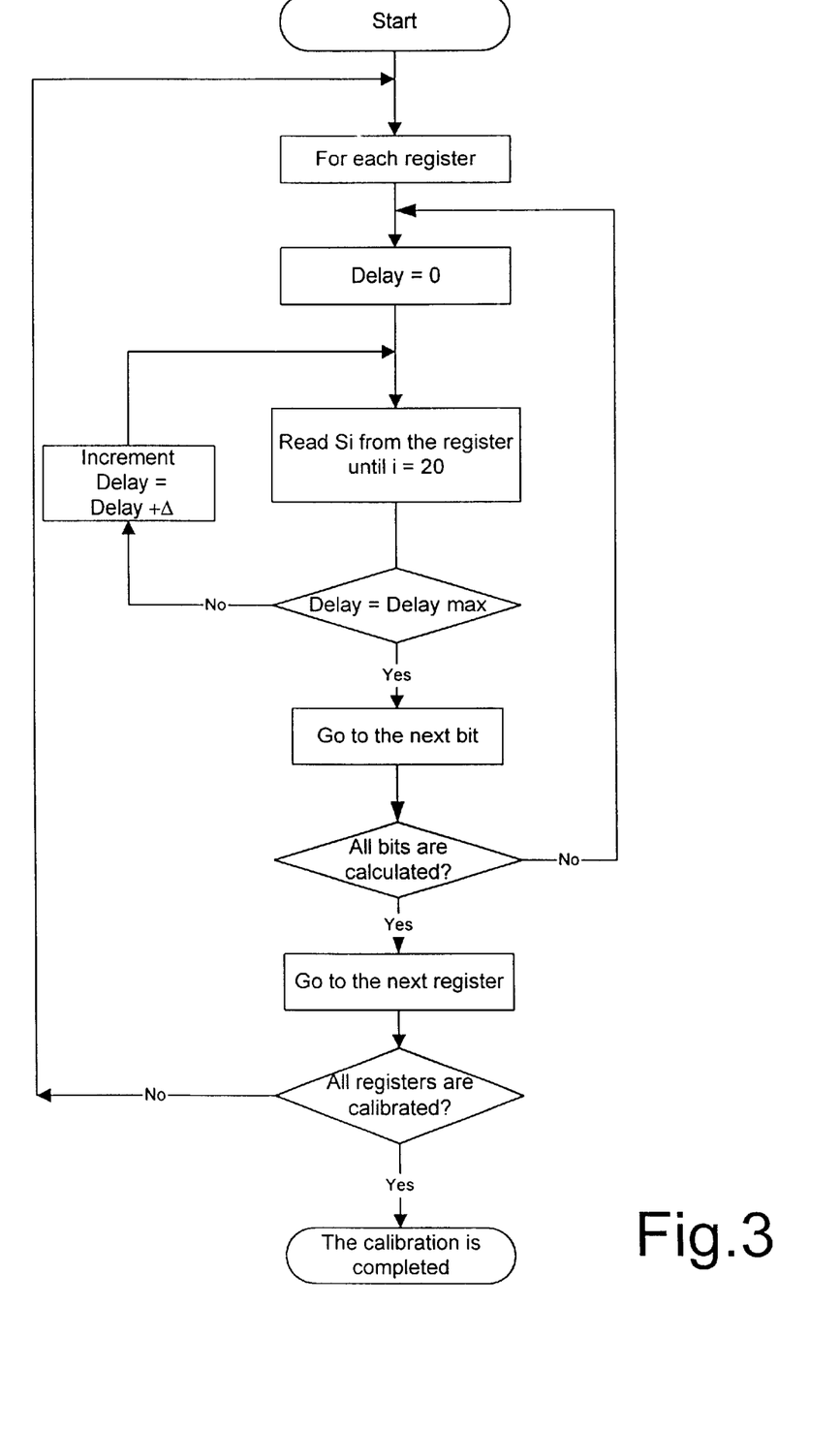
FIG. 3 is a flow chart diagram of the operation of a skew calibration means in accordance with the present invention.

A computer program can be easily created in any suitable language, e.g. C, C++, Assembler, etc, to implement the above calibration operation on the basis of a flow chart represented in FIG. 3.

I. Calibration of programmable delays

The first operation of the calibration procedure can be omitted in certain cases and it is preferably performed before the calibration of the registers. The operation comprises a preliminary calibration of the programmable delays that are used for calibration of registers, and ensures a high precision calibration.

Figure 4B:
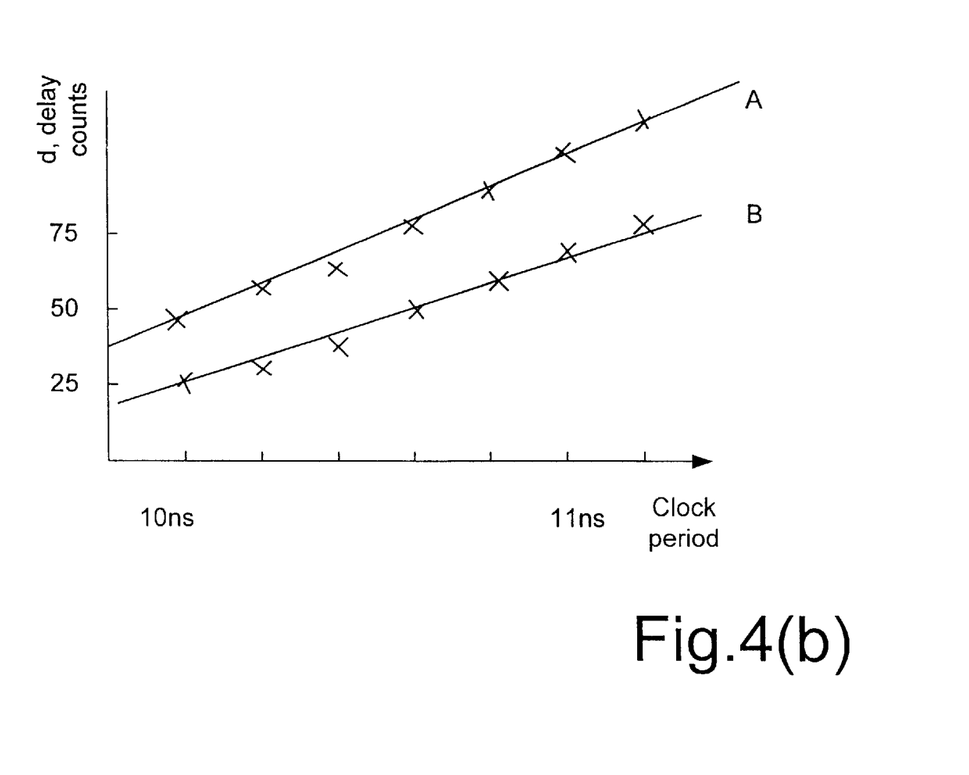
FIG. 4b shows a calibration graph for a programmable delay and illustrates the first step of calibration according to the present invention.

Programmable delays are characterised by the linear dependence of the delay value on a code that is sent to the delay (a typical graph of this dependence for delays A and B is shown in FIG. 4(b)). As shown in the figure, the slope of this linear graph varies from one delay to another within the same batch. It is also known that the calibration frequency influences the moment at which the transition occurs from one of the two possible states to the other. Inaccuracy caused by this influence is accounted for at this step. To define the delay characteristics accurately, each programmable delay is calibrated in situ after being installed in a calibration circuit but before the calibration of the registers. The delays are calibrated by varying the calibration frequency while keeping other variables constant, that making it possible to determine the threshold of the variable delay by fixing the difference in time of the two transition moments.

It should also be noted that in the course of this procedure a calibration graph is obtained with x, y coordinates, where 'x' is the clock period and 'y' the discrete delay unit (d, delay counts). To define the linear dependence in terms of time units (Td) along the y coordinate, the value of this discrete unit is determined in time units by the standard method of linear regression. Thus, each variable delay is assigned a transfer function $F_{tr}$ showing the dependence of the delay value on the code that is sent to the variable delay.

II. Calibration of output registers

The second operation is the calibration of each or at least some of the output registers in relation to the reference clock edge (although in this case, registers 4, 5 and 6 are shown in FIG. 1, it shall be understood that in practice the number of registers may be one hundred or more.) During the calibration operation, one of the switches is closed, depending on which bit of the register being calibrated is to be measured. For example, to calibrate register 6, the middle switch 25b shall be closed and input registers are tri-stated. Then the corresponding programmable delay 16 is varied to cover the whole delay range in accordance with the calibration procedure described above. In this case, the procedure is performed at the same frequency for different bits of the register.

This operation may be omitted in the case of new generation high-precision registers, or where registers specially manufactured for this purpose are provided, or where pre-calibrated registers are used. Conventional registers may also be used without adjustment, but there will be a certain decrease in the overall accuracy of the system.

Figure 5:
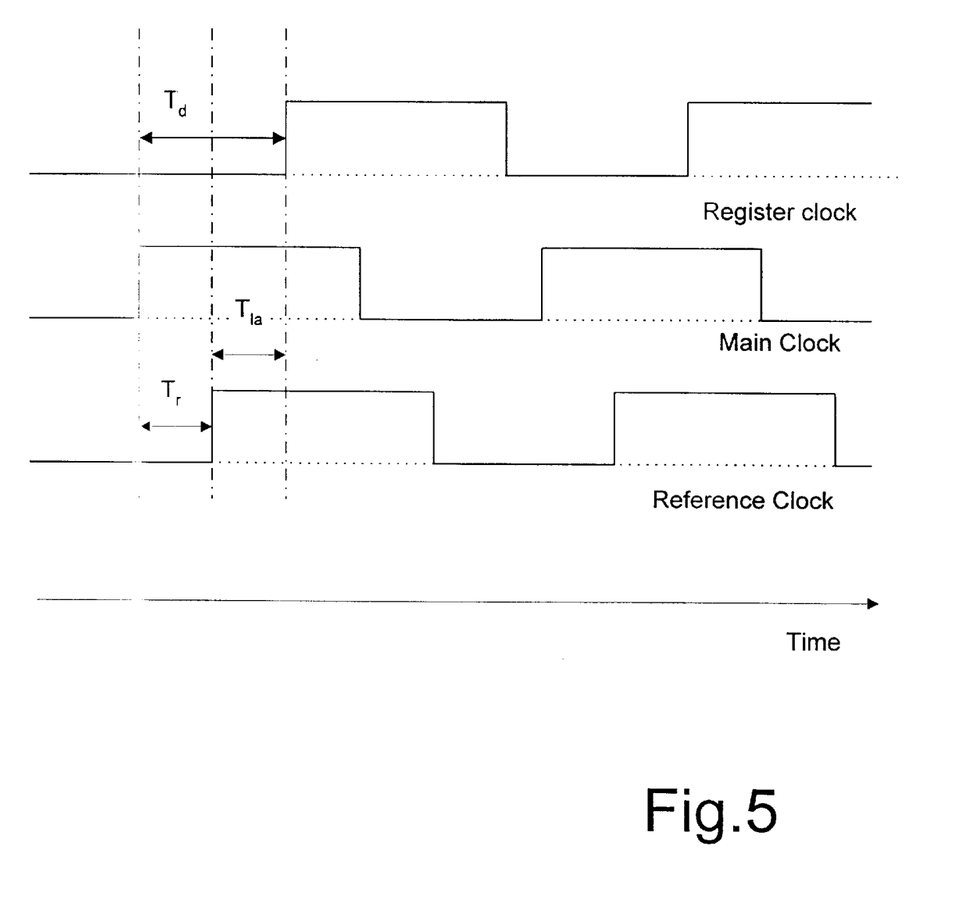
FIG. 5 is a timing diagram illustrating the skew calibration method in accordance with the present invention.

A timing diagram of this calibration operation is illustrated in FIG. 5. As shown in FIG. 5, a certain difference in time is observed between the moment when the register actually latches input data and the reference clock edge. At the end of the calibration procedure, corresponding delays, i.e. Td for a given bit in a given register, are introduced into the input and output channels to compensate for these time differences, Td being defined by the following formula:

$$T_d = T_{la} + T_r,$$

where $T_d$—actual value of signal delay;

$T_{la}$—an exact time of data latching in the register;

$T_r$—time required for the reference clock signal to reach a given bit of a given register via a transmission line. This time may be calculated from the PCB (printed circuit board) layout and/or checked and corrected by oscilloscope measurements.

However, uncertainty in determining the length of the delay to be nulled limits the accuracy of the calibration operation and, therefore, this uncertainty shall be minimised. Parameter $T_{la}$, representing the exact time of data latching in the register, is defined by an average of the setup and hold times for an actual register under given power supply and temperature conditions. However, this parameter may differ from the parameters indicated in datasheets, as these usually give the worst case values over temperature and power supply. Determining the actual time when the register latches the input data and the actual delay between this moment and the reference clock edge enables the accuracy of the test system operation to be increased. The determination is performed either for the falling edge, or for the rising edge of the reference clock, or it may be performed twice, once for the falling edge, and again for the rising edge to assure the accuracy. The accuracy of determining $T_d$ (time of delay) and therefore, $T_{la}$, as $T_r$ (time of reference clock edge) is a function of two values: register clock jitter and latch time uncertainty itself. Because of the difficulty of achieving an accurate calculation of the jitter and latch time window of uncertainty, the sum of these two values is determined experimentally. It has been found that the delay $T_d$ may be determined with an accuracy of 250 ps for both rising and falling edges of data at the input of typical TTL registers. Greater accuracy is available from some CMO Gallium Arsenide and ECL registers.

The accuracy of calibration of the output registers can now be determined on the basis of the experimental data. It is limited by the uncertainty of the actual time when the register latches data and is calculated as follows:

$$\Delta T_{sk(out)} = \Delta T_{sk(o)} + \Delta T_{unc},$$

where $\Delta T_{sk(o)}$ is the output skew of the reference clock driver which is equal to about 0.3 ns for a typical clock driver, e.g. SY100E111 manufactured by Synergy Semiconductor Corp. (U.S.A.). This skew can be reduced during the manufacturing process, but for the purposes of the present description it may be assumed that standard devices are used without adjustment. Alternatively, a single line having predetermined signal propagation parameters may be used. In this case, $\Delta T_{sk(o)}$ may be determined from the PCB (printed circuit board) layout and will be less than 0.3 ns;

$\Delta T_{unc}$ is the uncertainty of determining the difference in time between the moment when the register actually latches input data and the reference clock edge, and is determined to be in this case ±0.25 ns. This could also be measured as noted above. Though this accuracy may be assumed sufficient for the example embodiment of the present invention, in general, the proposed calibration means provides a scalable system capable of being adjusted to whatever increased accuracy may be desired when using registers with a higher inherent accuracy.

As for the main clock driver jitter, it is negligible, since the main clock driver is commonly implemented in a positive emitter coupled logic (PECL). Commercial Hybrid oscillators are able to achieve a 3 ps RMS (Root Mean Square) jitter. It shall also be noted that the output skew of the main clock driver is in any case compensated for in the course of the proposed calibration operation due to the averaging of data. Thus, typically, $$\Delta T_{sk(out)} = 0.30 + 0.25 = 0.55 \text{ ns}.$$

Thus, the output registers are calibrated with an accuracy of at least 0.55 ns, preferably less than 0.55 ns.

III. Calibration of input registers

The third skew calibration operation is the calibration of the propagation delay of each of the plurality of input registers 2,3. To perform the third operation of the calibration, the reference clock driver 24 is disconnected from the calibration means by opening all the switches 25. Then, input registers 2,3 are forced by the timing generator to produce either low-to-high or high-to-low transition on their outputs. The measurements may be performed for each individual bit of data transmitted from the output register, for which the best match with the latch time of the input registers 2–3 is found by varying the corresponding delays 13 or 15. A similar procedure is performed to find the best match the data transmitted from output register 4 with the latch time of clock driver 26. As a result, $Td_{(DUTclk)}$ is obtained. Although the delay shifts clock for the whole register, individual bits may be monitored and individual propagation delays may be obtained for each output bit of data from the input register. The accuracy of this measurement is limited by the accuracy with which delays have been determined at the previous step and may be calculated as follows:

$$\Delta T_{sk(in)} = \Delta T_{sk(out)} + \Delta T_{unc},$$

where $\Delta T_{sk(out)}$ is the accuracy of calibration of the output registers and is about 0.55 ns, as calculated above; $\Delta T_{unc}$ is the uncertainty of determining the difference in time between the moment when the register actually latches input data and the reference clock edge, in this case, ±0.25 ns.

$$\Delta T_{sk(in)} = 0.55 \pm 0.25 = 0.80 \text{ ns}.$$

Thus, the input registers can be calibrated with an accuracy of at least 0.80 ns, preferably less than 0.80 ns.

IV. Relative alignment of the measured delay

The final calibration operation is the relative alignment of the measured delay to the main clock.

After completion of the calibration procedure, the DUT clock is chosen as the reference clock to represent the calibration results. The corresponding delay compensation values, Tcomp, are input by the central control means into the programmable delays. This compensates for the major part of the skew.

However, there is still some remainder internal register skew, i.e. skew between pins of the same register (the number of pins may be, e.g. from 4 to 18), that cannot be compensated for in the course of the calibration procedure. For estimation of this skew by the user and for the purposes of convenience, this skew is measured to report it to the user together with the calculated compensation values. Skew of the each signal is calculated in relation to the DUT clock which is thereafter assumed to be zero. The following procedure is performed to determine the compensation values of the delays, wherein k is a bit number within a given plurality of registers, all bits within this plurality being numerated serially from the first bit of the first register to the last bit of the last register;

n is an input register's number within the given plurality of input registers, the total number of input registers being N;

m is an output register number within the plurality of output registers, the total number of output registers being N+1, which exceeds by one the number of input registers due to the presence of clock driver 24 which output is connected to the input of one of the output registers.

Step 1

The following data are input to determine the compensation values of the delay:

calibration graphs in digital form, obtained at operation II for each $m^{th}$ output register and for each $k^{th}$ bit of the output register;

individual reference clock delay values $Tr_k$ measured for each $k^{th}$ bit of the output register;

Step 2

Determine $Td_k$ for each bit k as $Td_k = d_k \times F_{tr}$, where $F_{tr}$ is a transfer function which is determined at operation I and $d_k$ is defined by 50% level for each $k^{th}$ bit for the $m^{th}$ output register;

determine $Tla_k = Td_k - Tr_k$ for each $k^{th}$ bit of the output register;

Step 3 determine an average meaning of $Tla_k$ of all bits for $m^{th}$ output register as $$\langle Tla \rangle_m = \sum_{k=k_m}^{k_{m+1}-1} Tla_k / (k_{m+1} - k_m),$$

where $k_m$ is the first bit number of the output register m;

determine min<Tla>$_m$;

calculate compensation delays as $$Tcomp_m(out) = \langle Tla \rangle_m - \min \langle Tla \rangle;$$

Step 4 (determining propagation time for each input register)

for each $n^{th}$ input register take $Td_k(in)$ determined in operation III;

for each $n^{th}$ input register take $Tla_k(out)$ determined in Step 2 for each $m^{th}$ output register which input is connected to the output of the $n^{th}$ input register;

calculate $Tco_k(in) = Td_k(in) - Tla_k(out)$; where Tco is "clock-to-output", i.e. propagation time;

calculate an average meaning of $Tco_k$ of all bits for $m^{th}$ output register as $$\langle Tco \rangle_n = \sum_{k=k_n}^{k_{n+1}-1} Tco_k / (k_{n+1} - k_n);$$

determine min<Tco>$_n$;

calculate a set of compensation delays for each input register as $Tcomp_n(in) = \langle Tco_n \rangle - \min \langle Tco_n \rangle$;

Step 5 take $Td(DUTclk)_k$ determined at operation III for DUT clock driver when the reference clock is switched off and the DUT clock is connected to the output registers;

take $Tla(DUTclk)_k$ for the output register which input is connected to the output of the DUT clock driver;

calculate $Tco_k(DUTclk) = Td_k(DUTclk) - Tla_k(DUTclk)$; where Tco is "clock-to-output", i.e. propagation time;

calculate an average meaning of Tco(DUTclk) for each $k^{th}$ bit of the clock driver as:

$$\langle Tco(DUTclk) \rangle = \sum_{k_{DUT}}^{k_{DUT}+L} Tco_{k(DUT)} / L,$$

where $k_{DUT}$ is the number of the first bit of the output register to which DUT clock is connected;

L is the number of DUT clock;

calculate compensation delay for each DUT clock driver as $Tcomp(DUTclk) = Tco(DUTclk) - \min \langle Tco \rangle_n$.

A computer program can be easily created in any suitable language, e.g. C, C++, Assembler, etc, to implement the above sequence of steps on the basis of the above description.

The following errors may cause inaccuracy in the register's calibration.

Different registers may differ in their threshold level, causing uncertainty of their electric parameters. Using the method of calibration discussed above, it is possible to obviate or at least alleviate this problem.

Registers typically have threshold voltage of about 1.5–1.6V, while the threshold for SDRAM's is about 1.4V. This may also cause errors in determining the transition between "0" and "1" states. In this case, it is possible to calculate the error in determining the time difference between the moment when the register actually latches data and the reference clock edge, which is represented by the formula $$\Delta t_{trh} = \Delta U / r,$$

where $\Delta t_{trh}$—the addition to the time difference between the moment when a register actually latches data and a reference clock edge, caused by threshold voltage differences;

$\Delta U = U$ actual $- U$ standard;

r—a signal's slew rate.

For the register's threshold voltages of about 1.5–1.6V, and SDRAM's threshold voltage of about 1.4V, as mentioned above, $\Delta U = 1.5V - 1.4V = 0.1V$; a signal slew rate r is about 2V/ns; thus, the uncertainty $\Delta t_{trh}$ is about 0.05 ns. In case U actual is 1.6V, the uncertainty will be even greater, i.e. about 0.1 ns, which constitutes a substantial part of the calibration accuracy. This is the systematic error that can be corrected as follows:

$$Tcomp_n = <Tco_n> - \min<Tco_n> - \Delta t_{trh}.$$

Another possible source of errors that must be taken into account when calibrating the registers at this step is the bushold circuit of the register that has a remnant memory of the preceding state of the register. Due to the existence of this remnant memory, the threshold values for the up-to-down and down-to-up transitions are different. This phenomenon causes a hysteresis loop in FIG. 4a. By measuring the loop width $\Delta t_{hys}$ it is possible to estimate the register's lowermost threshold uncertainty as follows:

$$\Delta T_{unc.eff.} = \Delta T_{unc.} \pm \Delta t_{hys}/2.$$

In FIG. 6 an example embodiment of the memory test system in accordance with the proposed invention is presented. The system shown is intended for testing a semiconductor memory 1 (DUT), for example SDRAM DIMM module. The system contains a timing means 2 for generating delay timing signals; a plurality 3 of drivers wherein at least one driver is a register, with a set 4 of phase shift means 4; a plurality of receivers 5, wherein at least one receiver is a register, with a set of phase shift means 7; a fault logic means 6; and a central control unit 8 connected to a computer interface 9.

The timing means 2 provides an appropriate sequence of addresses, data and control signals for accessing memory elements within the DUT 1 in accordance with the first step of the method of testing semiconductor devices proposed in the present invention. These data are fed to a set of input registers 3 whose function in the memory test system in accordance with one of the embodiments of the present invention is to maintain a predetermined standard level of logic signals including write data, addresses and control signals applied to the DUT 1. A set of pin drivers (not shown) may be used for conditioning logic levels to the needs of a specific DUT. A set 4 of phase shift means (e.g., programmable delay means) is used for calibration purposes to match the input timing of multiple test signal patterns. The read data obtained from the DUT are received by a set of receivers (e.g., output registers) 5 and compared with the predetermined levels of "0" and "1" in a fault logic means 6 to detect failures in the memory elements according to the next steps of the method of testing.

An analog comparator (not shown) may also be used before the output registers to compare the predetermined levels. From the output registers 5, the data in digital form are entered into a fault logic means 6 which compares real data with expected data coming from the timing means 2. Another set 7 of phase shift means (e.g., programmable delay means) for delaying received data to compensate the round trip delay, is used before the set 5 of receivers (e.g., output registers). The fault data from the fault logic means 6 are sent to the central control unit 8 and further to a computer interface 9 of a controlling computer (not shown) for processing test results according to the third step of the method of testing. The controlling computer preferably holds the accumulated data in an encoded format. The fault data may be represented also in a bitmap format for viewing the faults.

Instead of using conventional pin electronics for per-pin addressing of the DUT, the system shown in FIG. 6 uses two sets of registers, one for inputting data and another for receiving test data from the DUT. To achieve the strict accuracy required for testing high-speed semiconductor devices, conventional methods involve calibration of timings of each per-pin structure. The present invention avoids using time-consuming per-pin calibration by using a calibration means for calibrating registers thus enabling a fast per-register mode of calibration. In accordance with the present invention, the calibration operation may be performed both when the DUT is disconnected from the system, or, preferably, with the DUT connected to the test system. As the electrical characteristics of DUT itself may influence greatly the operation of the registers, it is highly important to be able to calibrate the test system by using the actual DUT to be tested, not by customary emulation of DUT characteristics.

Moreover, after the calibration operation is carried out in relation to the test system, the DUT registers may be calibrated as well. In this case the order in which the DUT registers are calibrated is not critical.

The present invention can also perform an analysis of DUT features, or any other integrated circuit device testing. For example, different DUT properties, e.g. electrical characteristics, may be examined in the course of the proposed test procedure. Thus, to determine the DUT pin capacitance, the calibration system is first calibrated as above. Then, a series of capacitors having predetermined capacitance values is tested using the same calibration system and measuring system parameters. The results obtained are plotted in the form of a calibration curve to determine the dependence of the system parameter P on the device capacitance, $P = f(C_{apacitance})$. The next step is to measure the same system parameter using a DUT to be tested in place of a capacitor. The desired DUT pin capacitance can be easily calculated from the calibration curve. As an alternative, a register in a memory test system or any other receiver coupled with a transmitter may be used.

It will be appreciated that the above description and the figures are an example embodiment only and that various modifications may be made to the embodiment described above within the scope of the present invention.

What is claimed:

1. An apparatus for automatic skew calibration of a synchronous transceiver, comprising:

a plurality of input registers, each input register having a plurality of inputs and outputs, at least one output of each said input register connectable to at least one input pin of a device under test, said input registers latching transmitted signals;

a plurality of output registers, each output register having a plurality of inputs and outputs, at least one input of each said output register connectable to at least one output pin of said device under test, said output registers latching signals received from said device under test;

a main clock for generating a main clock signal and being connectable to at least one input pin of said device under test;

a reference clock for generating a reference signal for calibrating the output registers; said reference clock being associated with said main clock; and a first set of phase shift means associated with said plurality of input registers, for the relative alignment of the input registers' timing within the plurality of input registers.

2. The apparatus according to claim 1, further comprising a common transmission line of known signal propagation rate for supplying said reference signal.

3. The apparatus according to claim 2, wherein each of said output registers are connected to said reference clock by said common transmission line of known signal propagation rate.

4. The apparatus according to claim 1, wherein each of said output registers for latching signals received from said device under test is pre-calibrated by determining a minimum feasible time delay between the reference clock edge and a moment when the register latches data.

5. The apparatus according to claim 1, wherein said first set of phase shift means comprises at least one shift means associated with each separate input register for delaying its timing.

6. The apparatus according to claim 1, further comprising a second set of phase shift means associated with said plurality of output registers, for relative alignment of the output registers' timing within said plurality of output registers.

7. The apparatus according to claim 6, wherein said second set of phase shift means comprises at least one shift means associated with each of said plurality of output registers.

8. The apparatus according to claim 6, further comprising a third set of phase shift means associated with said pluralities of input and output registers for relative alignment of the register's timing between said pluralities of input and output registers, said pluralities of registers being connected to the main clock via said third set of phase shift means.

9. The apparatus according to claim 8, wherein said third set of phase shift means comprises at least one shift means associated with each of the said pluralities of input and output registers.

10. The apparatus according to claim 1, wherein at least one of the components including the said plurality of input registers, said plurality of output registers, and said reference clock are part of a tester header.

11. The apparatus according to claim 1, wherein the input registers and output registers are interconnected so that outputs of input registers are connected to the inputs of respective output registers to calibrate said plurality of input registers.

12. A method for automatic skew calibration of a transceiver, comprising:
    calibrating a plurality of output registers of the transceiver, each of said output registers being connectable to at least one output pin of a test device, in relation to a reference clock edge;
    calibrating a propagation delay of a plurality of input registers of the transceiver, each of said input registers being connectable to at least one input pin of said test device, using the calibrated output registers;
    performing relative alignment of the delays to a main clock edge.

13. The method according to claim 12, further comprising calibrating a respective programmable delay for each output register before calibrating the output registers.

14. The method according to claim 13, wherein at least one step of the calibration is partially or completely computer implemented.

15. The method according to claim 12, wherein accuracy of calibration is increased by determining for at least one register a minimal feasible time delay between the reference clock edge and a moment when the register latches data.

16. The method according to claim 15, wherein the determination is performed twice, once for the falling edge of said reference clock, and again for the rising edge of said reference clock.

17. The method according to claim 9, wherein the propagation delay of each of the input registers is calibrated by varying delays to best match an output transition with a latch time of at least one of said output registers.

18. The method according to claim 12, wherein the propagation delays are calibrated for each individual bit of the output register data.

19. The method according to claim 12, wherein each output register has a respective delay device, and said calibrating of the output registers comprises varying a delay for the respective delay device for a respective output register over a range of possible delays and determining a statistical average over the range as a calibration result.

20. The method of claim 19, wherein a propagation delay of each of the input registers is calibrated by varying delays to best match an output transition with a latch time of at least one of the output registers.

21. The method according to claim 12, wherein said output registers are calibrated with reference to a periodic reference clock edge.

22. A memory test system for testing synchronous semiconductor devices comprising:
    a timing means;
    a fault logic means;
    a central control unit; and
    a tester header including
        a plurality of drivers comprising at least one input register connectable to an input pin of a device under test for transmitting signals;
        a plurality of receivers comprising at least one output register connectable to an output pin of the device under test for receiving signals; and
        a reference clock;
    wherein said reference clock is operable to calibrate the receivers using a first set of phase shift means associated with said plurality of receivers, for relative alignment of the receivers' timing; and
    said plurality of receivers is operable to calibrate said drivers using a second set of phase shift means associated with said plurality of drivers, for relative alignment of the drivers' timing.

23. The memory test system according to claim 22, wherein each said output register is connected to the said reference clock by a common transmission line of known signal propagation rate.

24. A computer readable memory operable in a memory test system for testing semiconductor devices, the memory comprising a computer program for performing skew calibration of the test system, comprising:
    computer readable program means for calibrating a plurality of output registers of the test system, each of said output registers being connectable to at least one output pin of a device under test, in relation to a reference clock edge;
    computer readable program means for calibrating propagation delays of each of a plurality of input registers of the test system, each of said input registers being connectable to at least one input pin of the device under test, using the calibrated output registers;
    computer readable program means for performing relative alignment of the propagation delays with reference to a main clock edge.

25. The computer readable memory operable in a memory test system according to claim 24, wherein each output register has a respective delay device, and said calibrating of the output registers comprises varying a delay for the respective delay device for a respective output register over a range of possible delays and determining a statistical average over the range as a calibration result.

26. The computer readable memory of claim 25, wherein a propagation delay of each of the input registers is calibrated by varying delays to best match an output transition with a latch time of at least one of the output registers.

27. A method of testing a synchronous semiconductor device, including:

transmitting a pattern of signals for accessing a set of memory elements within said semiconductor device, receiving response signals for detecting failures in the memory elements, processing test results, wherein the method further comprises skew calibration comprising:

calibrating a plurality of output registers of a test header, each of said output registers being connectable to at least one output pin of the semiconductor device in relation to a reference clock edge;

calibrating propagation delays of a plurality input registers of the test header, each of said input registers being connectable to at least one input pin of the semiconductor device, using the calibrated output registers;

performing relative alignment of the propagation delays to a main clock edge.

28. The method of testing according to claim 27, wherein the calibration is carried out when the test header is connected to a device under test.

29. The method of testing according to claim 27, wherein the method further comprises determining electrical characteristics of the device.

30. A computer readable medium including a computer readable program means for implementing or simulating hardware functions of a system comprising:

a plurality of input registers connectable to at least one input pin of a device under test, said input registers latching transmitted signals;

a plurality of output registers connectable to at least one output pin of said device under test for latching signals received from said device under test;

a main clock for generating a main clock signal;

a reference clock for generating a reference signal for calibrating the output registers; said reference clock being associated with said main clock;

a first set of phase shift means associated with said plurality of input registers, for the relative alignment of the input registers' timing; and a second set of phase shift means associated with said plurality of output registers, for the relative aligment of the output registers' timing.

31. The computer readable medium according to claim 30 for implementing or simulating hardware functions of a system further comprising:

a second set of phase shift means associated with said plurality of output registers for relative alignment of the output registers' timing.

* * * * *